US007449699B1

(12) United States Patent
Adams et al.

(10) Patent No.: US 7,449,699 B1
(45) Date of Patent: Nov. 11, 2008

(54) METHOD AND APPARATUS FOR CREATING A TOPOGRAPHY AT A SURFACE

(75) Inventors: David P. Adams, Albuquerque, NM (US); Michael B. Sinclair, Albuquerque, NM (US); Thomas M. Mayer, Albuquerque, NM (US); Michael J. Vasile, Albuquerque, NM (US); William C. Sweatt, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 267 days.

(21) Appl. No.: 11/478,573

(22) Filed: Jun. 29, 2006

Related U.S. Application Data

(60) Provisional application No. 60/793,662, filed on Apr. 20, 2006.

(51) Int. Cl.
*G21K 5/04* (2006.01)

(52) U.S. Cl. ............ 250/492.1; 250/492.2; 250/492.21; 250/492.22; 250/492.23; 250/492.3; 250/491.1; 250/309; 250/307; 250/310

(58) Field of Classification Search ............... 250/492.1, 250/492.2, 492.21, 492.22, 492.23, 492.3, 250/559.29, 306, 491.1, 309, 307, 310; 356/445, 356/450, 6, 4.08, 4.09
See application file for complete search history.

(56) References Cited

U.S. PATENT DOCUMENTS

| 4,986,664 | A | | 1/1991 | Lovoi |
| 5,073,018 | A | * | 12/1991 | Kino et al. .................. 359/368 |
| 5,905,266 | A | | 5/1999 | Larduinat |
| 5,920,073 | A | | 7/1999 | Lo et al. |
| 5,953,578 | A | | 9/1999 | Lee |
| 6,043,452 | A | | 3/2000 | Bestenlehrer |
| 6,165,057 | A | | 12/2000 | Gill |
| 6,373,070 | B1 | | 4/2002 | Rasmussen |
| 6,414,325 | B1 | * | 7/2002 | Yamada et al. ........... 250/491.1 |
| 6,586,703 | B2 | | 7/2003 | Isaji et al. |
| 6,783,643 | B2 | | 8/2004 | Golovchenko et al. |
| 2003/0224543 | A1 | | 12/2003 | Roy et al. |
| 2003/0224601 | A1 | | 12/2003 | Roy et al. |

OTHER PUBLICATIONS

Tsao et al., "Imaging and Material Analysis from Sputter-Induced Light Emission Using Coaxial Ion-Photon Column", Microelectronics Reliability 42, pp. 1667-1672, (2002).
Tsao, et al., "Coaxial Ion-Photon System", Microelectronics Reliability, 41, pp. 1483-1488, (2001).
Boit et al., "Voltage Contrast Like Imaging of N-Wells", Proceedings of The 29th International Symposium for Testing and Failure Analysis, Nov. 2-6, 2003, Santa Clara CA, USA, pp. 331-337.

(Continued)

*Primary Examiner*—Jack I Berman
*Assistant Examiner*—Michael Maskell
(74) *Attorney, Agent, or Firm*—William R. Conley

(57) ABSTRACT

Methods and apparatus whereby an optical interferometer is utilized to monitor and provide feedback control to an integrated energetic particle column, to create desired topographies, including the depth, shape and/or roughness of features, at a surface of a specimen. Energetic particle columns can direct energetic species including, ions, photons and/or neutral particles to a surface to create features having in-plane dimensions on the order of 1 micron, and a height or depth on the order of 1 nanometer. Energetic processes can include subtractive processes such as sputtering, ablation, focused ion beam milling and, additive processes, such as energetic beam induced chemical vapor deposition. The integration of interferometric methods with processing by energetic species offers the ability to create desired topographies at surfaces, including planar and curved shapes.

24 Claims, 6 Drawing Sheets

OTHER PUBLICATIONS

Stein et al., "Feedback-Controlled Ion Beam Sculpting Apparatus", Review of Scientific Instruments, vol. 75, No. 4, pp. 900-905, Apr. 2004.

Vasile et al., "Depth Control of Focused Ion-Beam Milling From a Numerical Model of the Sputter Process", J. Vac. Sci. Technol. B 17(6), pp. 3085-3090, Nov./Dec. 1999.

Adams et al., "Focused Ion Beam Sculpting Curved Shape Cavities in Crystalline and Amorphous Targets", submitted for publication to the J. Vac. Sci. Technol. B (2006).

Adams et al., "Optical Interferometric Microscope for Real-Time Monitoring and Control of Focused Ion Beam Processes", presented at the Annual Symposium of AVS, Boston, MA, Oct. 31-Nov. 3, 2005.

\* cited by examiner

The "Z" direction lies along an axis substantially normal to the plane of the figure.

Optical pixel: dotted lines
FIB pixel: solid lines
Area Processed: Bold line

Optical pixel: dotted lines
FIB pixel: solid lines
Processed Area: Bold line

METHOD AND APPARATUS FOR CREATING A TOPOGRAPHY AT A SURFACE

RELATED APPLICATIONS

This application claims the benefit of U.S. Provisional Application No. 60/793,662 filed on Apr. 20, 2006, herein incorporated by reference.

STATEMENT REGARDING FEDERALLY SPONSORED RESEARCH OR DEVELOPMENT

The United States Government has certain rights in this invention pursuant to Department of Energy Contract No. DE-AC04-94AL85000 with Sandia Corporation.

FIELD OF THE INVENTION

The present invention relates to methods and apparatus for controlling energetic beam processes that modify a surface of a specimen. The present invention additionally relates to methods and apparatus for controllably creating a topography at a surface of a specimen, by energetic beam processes.

BRIEF DESCRIPTION OF THE DRAWINGS

The accompanying drawings, which are incorporated in and form part of the specification, illustrate several embodiments of the present invention and, together with the description, serve to explain the principles of the invention. The drawings provided herein are not drawn to scale.

BACKGROUND OF THE INVENTION

Energetic beam processes utilize tools that generate, focus, and direct beams comprised of energetic particles, for example, photons, ions, electrons and/or accelerated neutral particles, to modify and/or analyze the surface of the specimen. Such modifications can include creating a topography at a surface. The topography of a surface can be described in terms of locations at the surface (e.g. represented by "x" and "y" positional coordinates) and the relative height or depth (e.g. "z") of the local surface at those locations. Energetic beam processes can be "additive" in that they add material to a surface, such as in laser thermal chemical vapor deposition, photochemical deposition, electron or ion induced chemical vapor deposition. Energetic beam processes can also be "subtractive" in that they remove material from a surface, such as focused ion beam milling, laser ablation, photochemical etching, sputtering and laser thermal etching.

Disclosed are methods and apparatuses whereby an interferometer, integrated with an energetic particle column, is used to monitor and provide feedback control of the depth, shape and/or roughness of features created at the surface of a specimen by energetic beam processes. The methods and apparatuses disclosed are suitable for specimens including planar, multi-planar, faceted, curved, irregular surface profiles and blind holes and, can be practiced in vacuum, atmospheric pressure and/or at pressures higher than atmospheric pressure.

DETAILED DESCRIPTION OF THE INVENTION

The following documents are incorporated herein by reference: U.S. Pat. No. 6,373,070 "Method Apparatus for a Coaxial Microscope with Focused Ion Beam", issued Apr. 16, 2002 to Rasmussen. Where a conflict exists between the definition of a term in the instant application, and the definition of the same or a similar term in that of an incorporated reference, the definition of the term as defined in the instant application is controlling.

The following exemplary embodiments serve to illustrate methods and apparatus for creating a topography at a surface of a specimen, according to the present invention. The methods and apparatus described can be employed on monolithic (single material) and/or heterogeneous (multi-layered and/or multi-material) specimens having flat, planar, irregular, blind holes, and/or curved surfaces. For illustrative purposes, the following examples include embodiments wherein the energetic particles are ions, and the energetic particle column comprises a Focused Ion Beam (FIB) tool. The reader of the instant disclosure will understand that with relatively minor modifications, the energetic particles could equally as well include photons, electrons, ions and/or accelerated neutral species, that are directed to the surface of a specimen.

Figure 1:
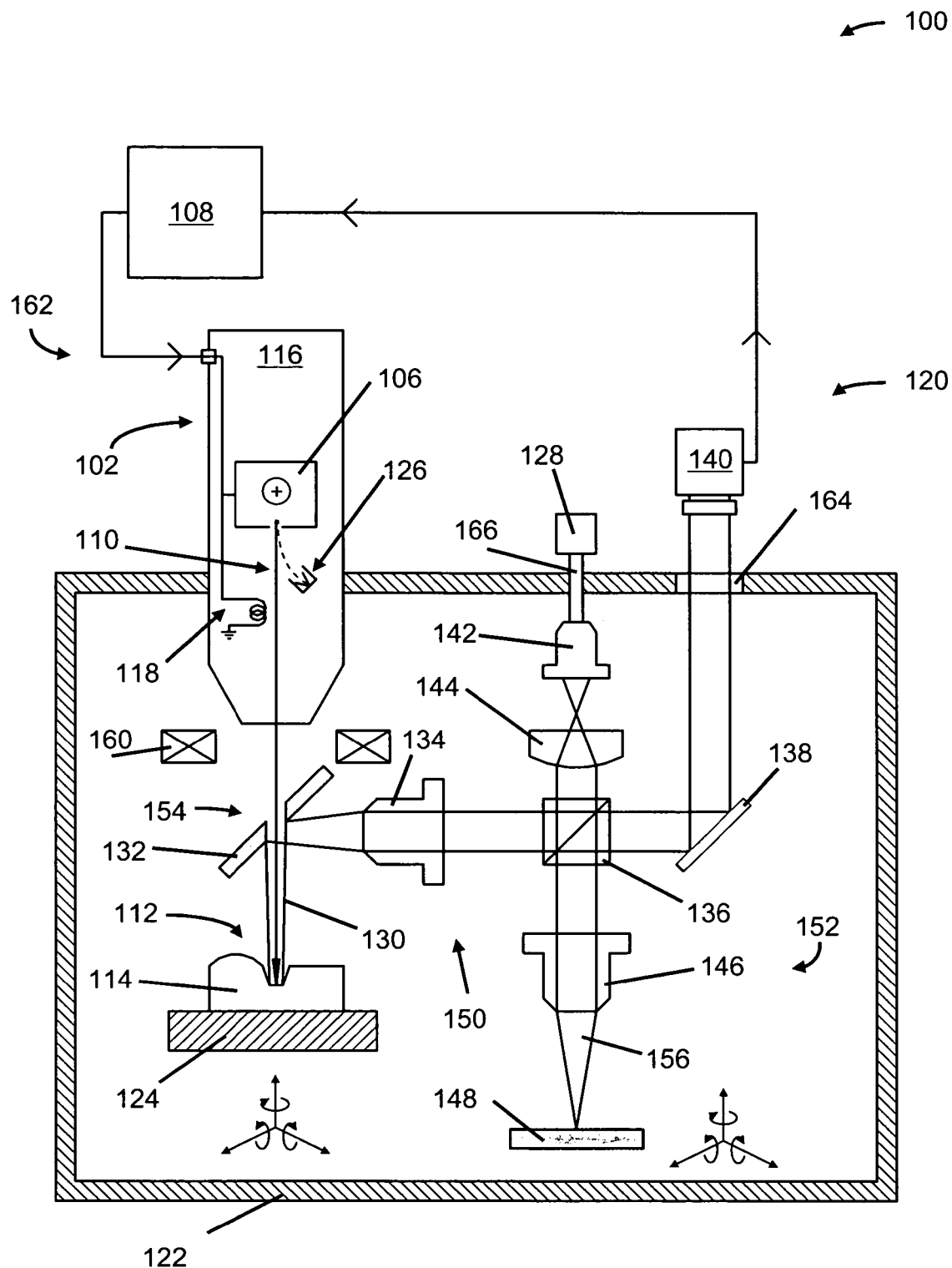
FIG. 1 is a schematic illustration of an embodiment of an apparatus for creating a topography at a surface, according to the present invention.

FIG. 1 is a schematic cross-sectional illustration of an embodiment of an apparatus 100 for creating a topography at a surface, according to the present invention. Apparatus 100 comprises an energetic beam tool, illustrated as a FIB tool 102, including an ion column 116 and ion source 106, and a controller 108. The ion column 116 can include focusing and steering mechanisms 118, such as magnetic and or electrostatic deflection coils, apertures, lenses, accelerating plates and focusing coils, for forming ions from the source 106 into an ion beam 110, and directing the ion beam to locations 112 at the surface of a specimen 114. Controller 108 provides a control signal to the ion column 116, which can include control of: the focusing and steering mechanisms 118, the ion source 106 (e.g. the ion output) the accelerating voltage and ion current of the ion beam 110, the dwell time of the ion beam 110 at locations 112, and other elements of the apparatus 100 as described herein, to controllably remove or add material to the surface of the specimen 114. The column 116 can include a beam stop 126 (e.g. a beam blanking mechanism) for trapping the ion beam 110 when it is desired to direct the ion beam 110 away from the surface of the specimen 114. The ion column 116 can extend into a vacuum envelope 122 that additionally can contain the specimen 114 and a specimen stage 124.

Apparatus 100 includes a Michelson-type interferometer 120 comprising a light source 128, beam splitter 136, primary objective 134 and an objective mirror 132 arranged to illuminate the locations 112 (e.g. a portion of the locations, or an area comprising the locations) at the surface of the specimen 114 with light from the light source 128. The objective mirror 132 is located between the ion source 106 and the specimen 114 and contains an aperture 154 (e.g. a "pinhole" or "through-hole") arranged to allow the ion beam 110 to pass through the mirror and onto the surface of the specimen 114. Light 130 exiting the objective 134 is reflected off the objective mirror 132 and onto the surface of the specimen 114. The interferometer 120 is arranged with respect to the FIB tool 102, and ion column 116, such that light 130 from the light source 128 is substantially coincident with the ion beam 110 at the locations 112 at the surface of the specimen 114. The interferometer 120 is said to be integrated with the ion column 116 (i.e. an energetic particle column) wherein the arrangement of the interferometer 120 with the ion column 116 is such as to allow exposing one or more locations at the surface of the specimen 114 to ions (i.e. energetic particles) and simultaneously measuring surface heights at one or more locations by means of the interferometer 120. This provides the capability to determine surface height values simultaneously or sequentially, with energetic particle processing, without for example, the need to transfer a specimen between processing and metrology tools, or re-registration of specimens between processing and metrology stations.

The interferometer 120 can include additional optical components such as a collimating objective 142 and lens(es) 144 to control the focus and beam width of the illuminating light 130. A portion of the light 130 illuminating the surface of the specimen 114 (e.g. locations 112) is reflected off the surface and travels a backward path reflecting off the objective mirror 132, through the objective 134, beam splitter 136, mirror 138 and into an imaging device 140. A first optical path 150 of the interferometer 120 includes the distance light travels from the beam splitter 136, through the objective 134, reflects off objective mirror 132 and onto the locations 112 at the surface of the specimen 114. In embodiments where the energetic particles comprise photons, the objective mirror 132 can comprise a dichroic mirror, a polarization beam splitter, a reflective grating or a mirror comprising a pattern of apertures. Additionally, in embodiments where the energetic particles comprise photons, the paths of the energetic particle beam and the light path of the interferometer could be interchanged. Interferometer 120 includes a reference objective 146 and reference mirror 148 comprising a second optical path 152 including the distance light 156, from the light source 128, travels from the beam splitter 136 through the reference objective 146 and to the surface of the reference mirror 148. A portion of the light is reflected off reference mirror 148 and travels back through reference objective 146, beam splitter 136, mirror 138 and into the imaging device 140.

A portion of the light 130 reflected off the locations 112, and a portion of light 156 reflected off the reference mirror 148, are received by the imaging device 140 and interferometrically combined to create interference patterns due to changes in the length of the optical paths 150 and 152 and/or the topography of the area 112, at the surface of the specimen 114, due to processing by the beam of energetic particles. The imaging device 140 can be in the form of a charge coupled device (i.e. CCD camera) or other optical imaging device, and can have an electrical, analog or digital output, and can include a monitor or display (not shown) for convenience and observation by a user. The output of the imaging device 140 can be provided to the controller 108 (e.g. a computer) for image processing and/or analysis.

In various embodiments of the invention, the controller 108 (e.g. a computer) can be utilized to perform a comparison of interferometric data comprising a current (e.g. currently existing) surface height profile (i.e. topography) of locations at the surface 112, to a desired surface height profile for the locations 112 to determine a difference. A surface height profile (i.e. topography) can comprise a surface height (e.g. "z") information for one or more locations (i.e. x-y coordinates) at the surface. A difference can comprise subtracting current surface heights from desired surface heights for each of the one or more locations to obtain a height difference (e.g. delta) for each of the one or more locations (e.g. a difference matrix). The controller 108 can then generate (or modify) a control signal 162 for the ion column 116, based upon the difference, to adjust the dose of ions delivered to each of the one or more locations, for example, by providing real-time feedback control of the ion column 116, to produce the desired surface height profile. In practice, the controller 108 can be realized as one or more control devices or computers.

The interferometer 120 can comprise two optical paths 150 and 152, and corresponding imaging objectives 134 and 146. Creating interferograms as the topography at the locations 112 at the surface evolves with processing by the ion beam 110, can be facilitated by translating either the specimen 114 or the reference mirror 148 along their respective axis(es) of illumination as defined by their associated optical paths, 150 or 152 respectively. In one embodiment, the reference mirror 148 can be initially positioned in front of the reference objective 146 at a distance equal to the distance between locations 112 at the surface and the primary objective 134, and the reference mirror 148 then translated along the axis of the optical path 152 to generate interferograms, as topography at the locations 112 evolves. In another embodiment, the distance between the reference mirror 148 and the reference objective 146 can remain fixed, while the specimen 114 is translated along the axis of the optical path 150 by moving the specimen stage 124. Maintaining alignment of the axis of the ion beam 110 and the axis of the optical path 150a, to the locations 112 at the surface (e.g. beam and optical axes aligned and perpendicular to the local surface) can be assisted by utilizing a specimen stage 124 having tilt/tip and rotational features.

The area of the surface illuminated by the light 130 can be greater than the area comprising the locations 112 at the surface exposed to the ion beam 110. In such embodiments, the illuminated area can include an unexposed area or border (e.g. surrounding the locations 112) which can assist an operator in identifying the progress of a processing operation, i.e. the interferometer can be utilized to measure surface heights at locations not exposed to the ion beam, as well as measuring surface heights at locations 112 exposed to the ion beam. In other embodiments, the area of the surface illuminated by the light 130 can be equal to or less than the area comprising the locations 112 exposed to the ion beam 110. In other embodiments, locations 112 exposed to the ion beam can comprise a plurality of spaced locations, for example, as can occur in embodiments where it is desired to induce roughness at the surface of a specimen. In still other embodiments, a reflection off the surface of the specimen itself can be used as a reference reflection, i.e. as a reference mirror, for making interferometric measurements. In such applications, two optical paths (e.g. 150 and 152) can be combined along a common path, which can be appropriate for instances subject to vibrations, noise or thermally induced variations.

In the practice of the present invention, it is not necessary for the specimen 114 to be transparent to light from the light source 128, nor is it required that the specimen 114 be completely opaque to light from the light source 128. It is only required that the specimen reflect enough light to allow the creation of interference patterns by the interferometer. This provides for the present invention to be applicable to a wide variety of specimen materials. For example, if a specimen where transparent and/or thin, reflections off the back (e.g. bottom) surface of the specimen could be problematic. In such cases, the problem can be easily overcome by coating the back surface of the specimen with an index-matching coating that will absorb the incident illumination, thus preventing back surface reflections from interfering with the measurements. In the embodiment as shown in FIG. 1, the reference mirror 148 is illustrated as an optical component separate from the specimen 114. In other embodiments, a reference area can be defined on the specimen surface itself for use as a reflective reference surface (e.g. a reference mirror) the reference area comprising locations not exposed to the ion beam 110. For example, the reference area can be adjacent to the locations 112 being exposed to the ion beam 110.

In the embodiment shown in FIG. 1, the imaging device 140 and light source 128 (e.g. a light emitting diode, or "LED") are illustrated as mounted external to the vacuum envelope 122 and light is communicated into and out of the vacuum envelope 122 by transmission elements that can include a fiber optic cable 166 and an optically transparent view-port 164. Optical and other components (e.g. mounts and shields) associated with the interferometer 120 can be mounted within the vacuum envelope on a translatable mechanism (not shown) for withdrawing these components from the vicinity of the specimen 114 as can be desired on occasion. This can accommodate additive energetic beam processes involving a deposition, for example, a chemical vapor deposition of a material onto the surface of the specimen 114, where gas feed sources are brought into close proximity to the specimen 114 and it can be desired to prevent deposition of materials onto optical components.

A secondary electron detector 160 (illustrated as an annular detector) can be mounted above the surface of the specimen 114 to produce images formed by the collection of secondary electrons ejected from the surface of the specimen 114 by the bombardment of the surface by energetic species from the ion beam 110. In embodiments of the invention, the secondary electron detector 160 can be arranged with respect to the other components (e.g. objective 134 and objective mirror 132) within apparatus 100, so as to have a "clear view" of the surface. These images can be useful to an operator in aligning the specimen 114 with the ion and optical components of the apparatus 100. Simultaneous optical and secondary electron imaging of a recognizable feature (e.g. a topographical feature) on the specimen 114 can be used to determine when the axis of the ion beam 110 and the optical path of the interferometer (e.g. 150) are coincident and rotationally aligned, at the surface of the specimen. Alternatively, a point on the specimen stage 124 (e.g. a machined corner) can be used for alignment.

In one embodiment of the invention, light source 128 produced light having a wavelength of about 530 nm, interferometer 120 comprised objectives (134 and 146) that were designed and built having a working distance of about 39 mm, a field of view of about 0.2 mm, a numerical aperture ("NA") of about 0.38, and an in-plane resolution of about 1 μm. The objective design comprised eight lenses arranged as three doublets and two singlets with all spherical surfaces. Lens diameters were on the order of 36 mm with lens face radii ranging from about 16 mm to about 30 mm. The lenses can operate with light of wavelengths from about 510 nm to about 550 nm. The long working distance of these objectives (about 39 mm) allows placing the primary objective 134, external to the ion column 116, thereby not requiring modification of the ion column to accommodate interfacing the ion column 116 to the interferometer 120. In other embodiments, a light source (e.g. laser diode) producing a beam having a shorter wavelength could be employed to improve the system's resolution. Additionally, a charge dissipative coating, for example a coating of indium tin oxide, or other transparent conductive (or charge dissipative) coating, can be applied to the objectives to minimize the effects of charge build-up on the objectives during processing.

Figure 2:
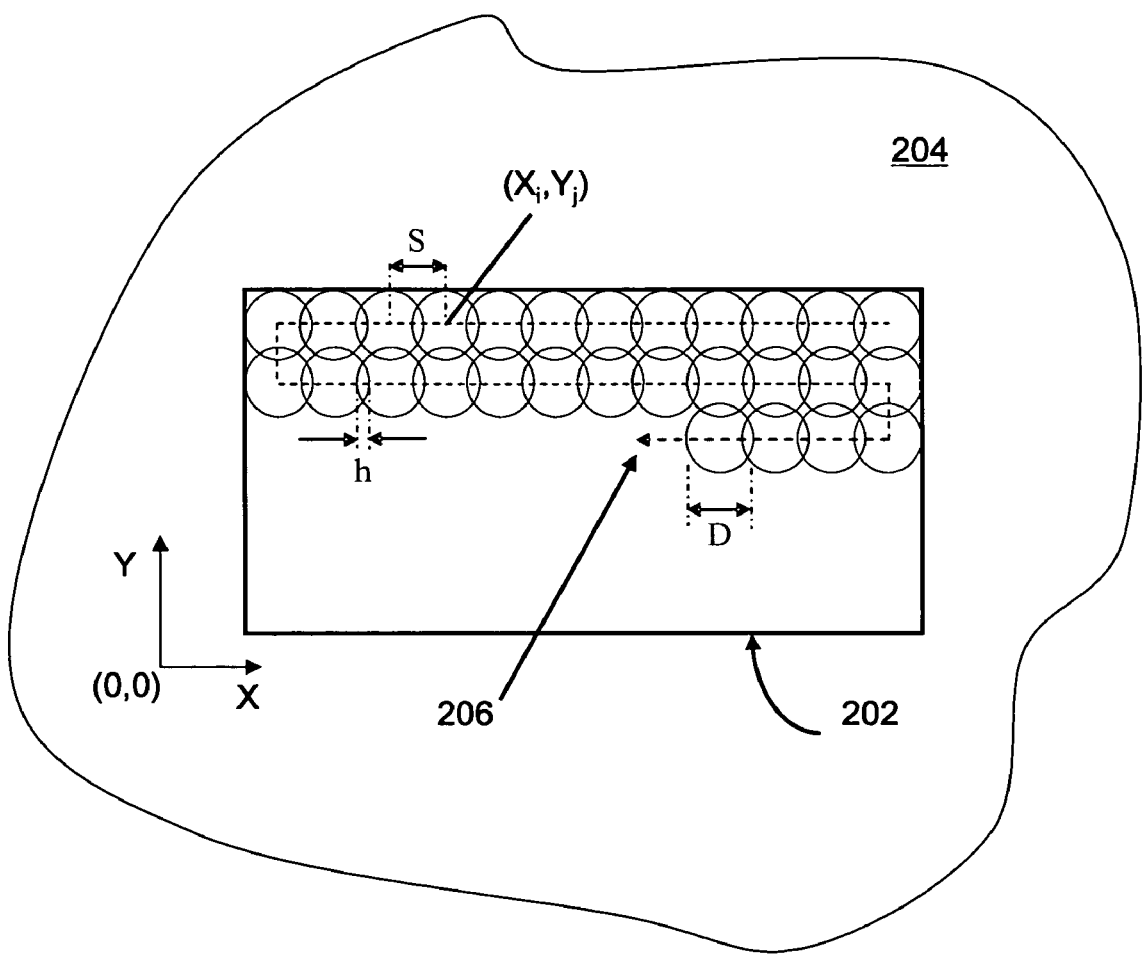
FIG. 2 is a schematic illustration of a method for defining locations on a surface of a specimen, for processing by energetic particles.

FIG. 2 illustrates an exemplary method for defining locations at the surface of a specimen 204 (e.g. locations 112 in FIG. 1) within an area 202 at the surface of the specimen 204. An energetic particle beam impinging on the surface of the specimen can have a circular cross-section of diameter "D". The beam can be rastered across the surface, in a boustrophedonic scanning mode, as indicated by the path 206. The path of the ion beam can be modeled as a matrix of "X-Y" coordinate locations representing the central position of the energetic particle beam, i.e. $(X_i, Y_j)$ whereat the beam can reside for a time (e.g. including times of zero duration) and then be directed on to another X-Y coordinate location. The X-Y coordinate locations can be uniformly spaced within the area 202, and separated by a distance "S", corresponding to filling the area 202 with circles equivalent to a beam of diameter "D" and overlapping by an amount "h". Focused ion beams can have a near-Gaussian intensity distribution with the full-width at half maximum (i.e. "FWHM") diameter of the intensity distribution, represented in FIG. 2 by the dimension "D". The amount of beam overlap with respect to the FWHM can be set to a dimension "h" in both X and Y directions as shown, or can as well be independently set in the two opposing directions (X and Y). The origin of the X-Y coordinate system (i.e. "0,0") can be assigned to a physical feature at the surface of the specimen, and can be located external (as shown) or within the area 202 comprising the $(X_i, Y_j)$ locations exposed to the beam. The location of the origin is a matter of convenience and could as well be assigned to some other physical feature or fiducial, including for example, a location on a specimen support or stage. The area 202 is illustrated as rectangular, but could comprise any shape or outline as convenient for a given application. For example, the area can be a square, a rectangle, a circle, an annulus or other shape of convenience, and can include one or more separate or spaced areas as may be required by an application. The example makes use of a Cartesian coordinate system, but other coordinate systems, for example, a polar coordinate system could be used as well.

Figure 3:
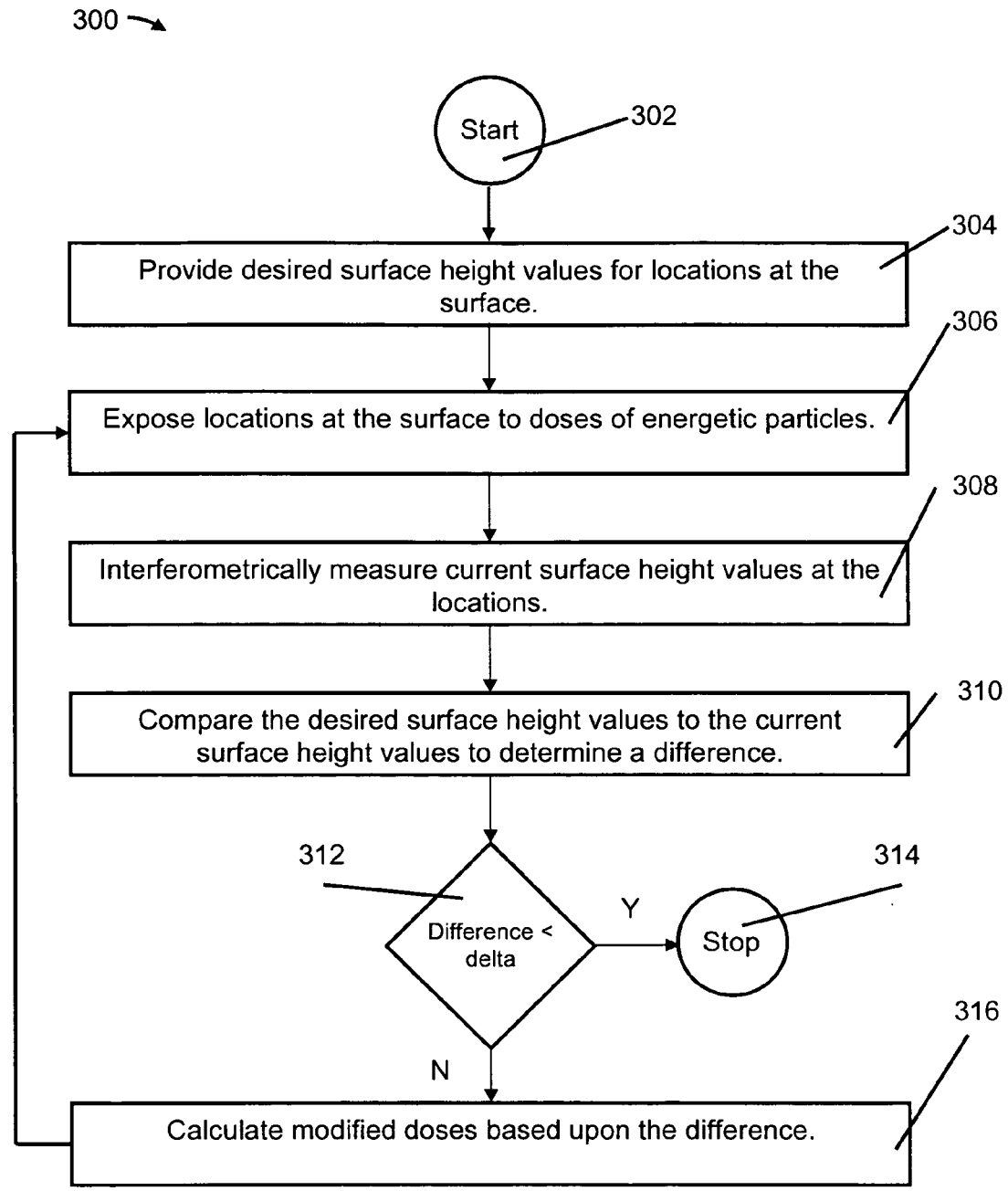
FIG. 3 is a flow chart diagram illustrating an embodiment of a method for creating a topography at a surface, according to the present invention.

FIG. 3 illustrates an embodiment of a method 300 for creating a topography at the surface of a specimen, according to the present invention. In this example, controlled doses of energetic particles can be delivered to specified locations at the surface of the specimen to produce a desired topography (e.g. a surface profile). A dose of energetic particles is defined as the number of energetic particles per unit area imparted to a location. A "dose" can also be defined in terms of X-Y coordinates for a plurality of locations at a surface, and the number of energetic particles per unit area delivered to each of the X-Y coordinate locations. Doses can be controlled by a number of methods, including for example, fixing the current (i.e. the number of energetic particles per unit time) of a beam of energetic particles and controlling the time the energetic particle beam resides at a given location (i.e. controlling the dwell time of the beam at each X-Y location). Alternatively, the dwell time of the beam can be fixed for each location and the beam current varied. In other embodiments, the accelerating voltage of a beam of energetic particles can be varied to affect the control of a "dose" of accelerated particles. The latter can be convenient in processes where a material removal or additive rate is a function of the accelerating voltage of the beam.

The method starts at step 302. At step 304 the X-Y coordinates and desired surface height values for locations at the surface of a specimen are defined. This can for example, comprise a matrix input to a controller including X-Y coordinate locations within an area, and values for the desired heights (or depths) of the surface at those locations. A mapping of X-Y locations and surface height values can be used to describe a topography at a surface, alternatively referred to as a "surface profile". Desired X-Y surface height information can for example, be generated by automated computer design tools. Height information can be referenced to the original position of the surface, e.g. the original position of the surface can represent "0" height, and desired surface height values can be negative for example, where subtractive processing is employed, or positive where additive processing is employed. This approach is one exemplary method that can be used where an initially flat specimen is to be processed by an energetic particle beam, to achieve a desired surface profile.

At step 306 the controller can be utilized to direct the energetic particle beam to the locations at the surface of the specimen, exposing the locations to doses of energetic particles. For exemplary embodiments utilizing a focused ion beam (FIB) to mill (i.e. etch) a topography into a surface, doses can be determined by assigning ion beam dwell time values to the locations at the surface, i.e. setting beam dwell times to a pre-determined value or alternatively, calculating beam dwell time values by estimating the ion dose(s) required to remove a specific amount of material at a location. Methods for estimating ion dose(s) based on calculations of material removal rates are described elsewhere, see for example, M. J. Vasile, J. Xie, and R. Nassar, "Depth Control of Focused Ion-Beam Milling From a Numerical Model of the Sputter Process", J. Vac. Sci Technol. B 17 (1999) pp 3085-3090, and D. Adams, M. Vasile and T. Mayer, "Focused Ion Beam Sculpting Curved Shape Cavities in Crystalline and Amorphous Targets", submitted to the J. Vac. Sci Technol. B (2006). These calculations for required ion dose per location can account for several factors including the ion beam spatial distribution (i.e. the FWHM) and the angular dependence of the removal rate, often referred to as yield (i.e. atoms removed per incident ion). The ion beam spatial distribution can be useful to consider as while the majority of the beam may be incident upon a given location, there can be portions of the beam incident upon neighboring locations (see for example, the beam overlap "h" in FIG. 2). The angular dependence of the sputter yield can also be useful to consider as a surface profile develops with exposure to the ion beam. For example, in creating a curved surface profile, a range of surface normal angles relative to the axis of the ion beam can develop over the area being processed (i.e. as a function of X-Y coordinate location). The estimated ion dose at each location can account for an evolving curved surface having a specific angle of incidence that can influence the sputter yield at that location. Sputter yield and its dependence on the angle of incidence of the ion beam can be determined by experiment or estimated by calculations based on semi-empirical formulations.

For exemplary embodiments where the desired surface height at a location is greater than the initial surface height, doses can be estimated based on experimental measurements or calculations of the dose(s) required to add a specific amount of material at a location, for example by a deposition process (e.g. ion induced chemical vapor deposition). Doses can be controlled by a number of methods as described above, including for example, by controlling the dwell time of an energetic beam at locations at the surface.

At step 306 the controller can direct the energetic particle column to expose locations at the surface of the specimen to doses of energetic particles. While this could comprise scanning an energetic particle beam across the surface in one pass, and varying the dose of particles delivered to the locations within one scan or pass, it can be convenient to partition the delivered doses into multiple passes (e.g. on the order of 10,000 to 1,000,000 passes, i.e. scans). Partitioning doses into multiple scans can be employed in various embodiments, for example in etching processes, to minimize the effects of re-deposition of material removed from a surface. For an exemplary embodiment wherein doses are controlled by controlling the dwell time of the energetic particle beam at the locations, the dwell time values can be derived from the calculated doses, the beam current and the number of specified scans, if dose partitioning is implemented.

At step 308 current surface height values for the locations are measured interferometrically. This can be accomplished for example, by fixing the position of a reference mirror, and translating the specimen along the axis of the beam (see for example the arrangement illustrated in FIG. 1) and generating interference patterns. This could also be accomplished by fixing the position of the specimen, and translating a reference mirror or other mirror disposed along an optical path of the interferometer. In some embodiments of the invention, the output of the interferometer (for example, a digital imaging device attached to the interferometer) can be provided to a controller for processing the interferograms to generate the surface height values. This can be accomplished for example, on a pixel by pixel basis of a digital imaging device. In various embodiments of the invention, the area measured by the interferometer can include an unexposed area or border (e.g. surrounding the exposed locations) which can assist an operator in identifying the progress of a processing operation, i.e. the interferometer can be utilized to measure surface heights at locations not exposed to the ion beam, as well as measuring surface heights at locations exposed to the ion beam. In other embodiments, the area of the surface measured by the interferometer can be equal to or less than the area comprising the locations exposed to the ion beam. In other embodiments, locations exposed to the ion beam can comprise a plurality of spaced locations, for example, as can occur in embodiments where it is desired to induce roughness at the surface of a specimen.

At step 310 the controller can be utilized to compare the measured, current surface height values to the desired surface height values to compute a difference. For example, the difference can comprise a plurality of difference values, one for each of the locations at the surface.

At step 312, if the difference is within acceptable limits i.e. "delta", the method ends at step 314. Delta can represent either an absolute height difference or a percentage of the desired surface height values. Delta can comprise a plurality of delta values, e.g. one for each location at the surface.

At step 316, if the difference for one or more locations is not within the acceptable limit (i.e. delta) the controller can be utilized to calculate (e.g. estimate) modified (e.g. updated) doses for those locations, and the method returns to step 306 wherein these locations are exposed to the beam according to the modified doses. The cycle can be repeated as necessary to achieve the desired surface height values at each of the locations (i.e. the desired topography).

In FIG. 3, at step 306, exposing the locations to the beam of energetic particles, and the step 308, making interferometric measurements, can occur simultaneously or sequentially.

Simultaneous interferometric measurements can be obtained while the surface of the specimen is exposed to the energetic particle beam. Sequential measurements can occur during operations where the energetic particle beam is momentarily blanked, directed away from the surface of the specimen, or the source of energetic particles switched off (e.g. energetic beam turned off) while the interferometric measurement is made. The order of making an interferometric measurement(s) and exposing the surface of the specimen to the energetic beam can be selected as convenient for an application. In embodiments where the energetic particle beam is being used to modify the roughness of an area at a surface, doses at step 306, can be directed to expose or dose only selected portions i.e. defined by a subset of locations, at the surface. The locations at the surface of the specimen processed by the beam, and measured interferometrically, can include portions of the surface that are flat, planar or curved, and can contain blind holes and features, as there is no need for the beam to pass through the specimen.

Figure 4:
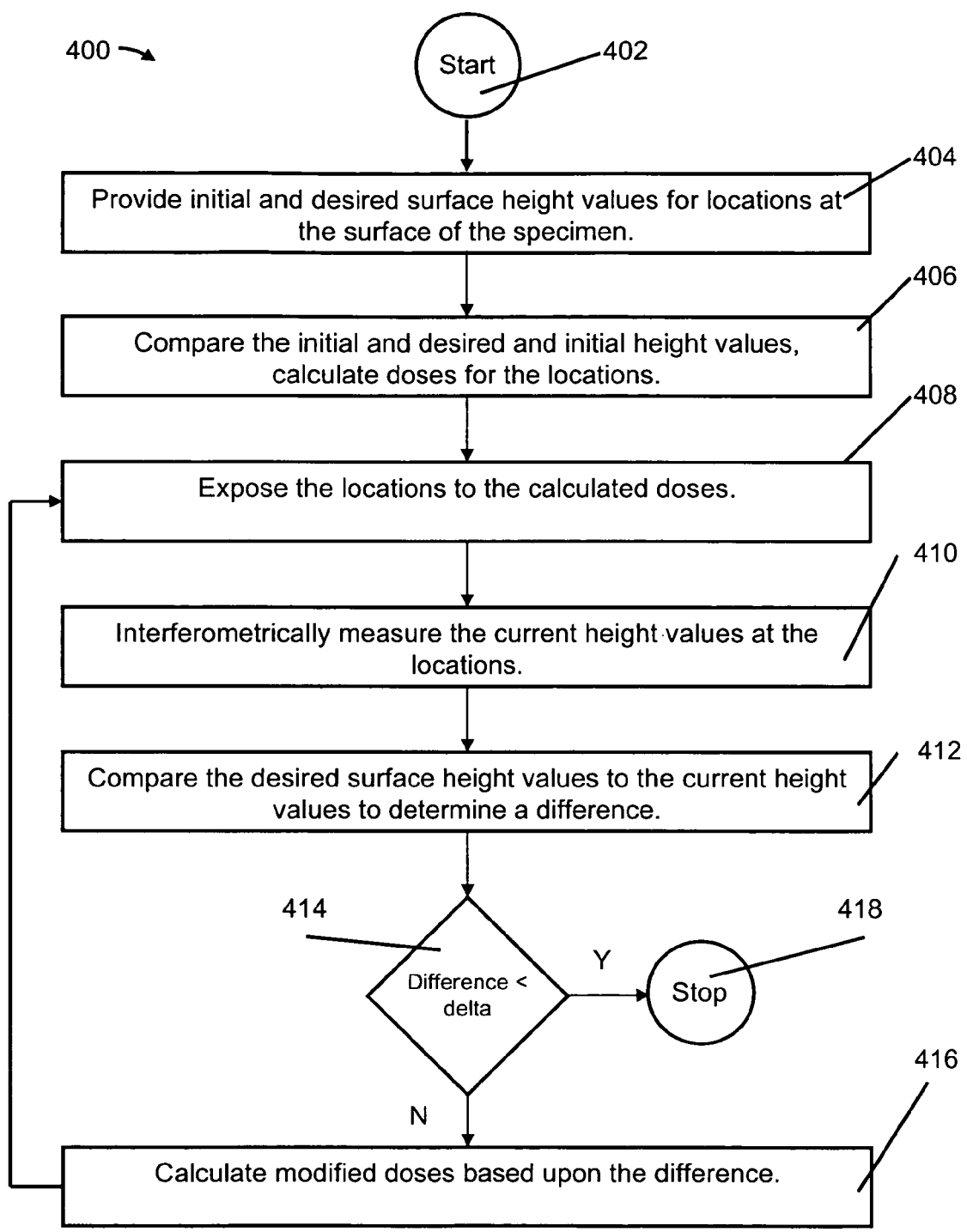
FIG. 4 is a flow chart diagram illustrating another embodiment of a method for creating a topography at a surface, according to the present invention.

FIG. 4 illustrates another embodiment of a method 400 according to the present invention. In this example, doses of energetic particles received at locations on the surface of a specimen can be controlled, as a beam of energetic particles is rastered (e.g. scanned) across the surface. The method starts at step 402. At step 404 X-Y coordinates for locations at the surface and initial, as well as desired surface height values are defined for the X-Y locations. This can for example, comprise inputting matrices to a controller including X-Y coordinate locations within a defined area, and values for the initial and desired heights (or depths) of the surface at those locations. Desired X-Y-surface height information can for example, be generated by automated computer design tools. Initial (e.g. pre-existing) surface height information can as well comprise a computer generated model of the surface or can comprise interferometrically generated information. The latter can be convenient in embodiments wherein it is desired to process a surface that is not initially flat, or where a specimen to be processed comprises a surface having curvature, and/or irregular surface features.

At step 406 the controller can be utilized to compare the desired surface height values to the initial surface height values to compute a difference. For example, the difference can comprise a difference for each of the locations at the surface. The controller can then calculate doses for the locations, using the methods described above.

At step 408 the controller can be utilized to direct the energetic particle beam to the locations at the surface of the specimen, exposing the locations to the calculated doses of energetic particles. As described above, partitioning doses into multiple scans can be employed in various embodiments for example, to minimize the effects of re-deposition of material removed from a surface. For an exemplary embodiment wherein doses are controlled by controlling the dwell time of the energetic particle beam at the locations, the computed dwell times are derived from the calculated doses, the beam current, and the number of specified scans, if dose partitioning is implemented.

At step 410 current surface height values for the locations are measured interferometrically. This can be accomplished for example, by fixing the position of a reference mirror, and translating the specimen along the axis of ion beam and generating interference patterns. This could also be accomplished by fixing the position of the specimen, and translating a reference mirror or other mirror disposed along an optical path of the interferometer. In embodiments of the invention, the output of the interferometer (for example, a digital imaging device attached to the interferometer) can be provided to a controller for processing the interferograms to generate the surface height values. This can be accomplished for example, on a pixel by pixel basis of a digital imaging device.

At step 412 the controller can be utilized to compare the measured current surface height values to the desired surface height values to compute a difference. For example, the difference can comprise a difference for each of the locations at the surface.

At step 414, if the difference is within acceptable limits i.e. "delta", the method ends at step 418. Delta can represent either an absolute height difference or a percentage of the desired surface height values. Delta can comprise a plurality of delta values, e.g. one for each location at the surface.

At step 416, if the difference (for one or more locations) is not within an acceptable limit (i.e. delta) the controller can be utilized to calculate (e.g. estimate) modified (i.e. updated) doses for those locations, and the method returns to step 408 wherein the locations are exposed to the ion beam according to the modified doses. The cycle can be repeated to achieve the desired surface height values at the locations (i.e. the desired topography).

In exemplary embodiments of the invention according to FIG. 1, it can occur that an optical interferometer can resolve an X-Y coordinate location as an area having dimensions of about 1 µm by about 1 µm. A focused ion beam tool can have a much finer resolution. For example, a focused ion beam tool can resolve the same 1 µm by 1 µm area as approximately 82×82 locations. The "optical pixel" e.g. about 1 µm by about 1 µm, in this example is larger than the "FIB pixel", e.g. 82×82 FIB pixels can be contained within a given optical pixel. In this example, the FIB tool can process (i.e. expose) much smaller areas than can be measured by the interferometer.

Figure 5:
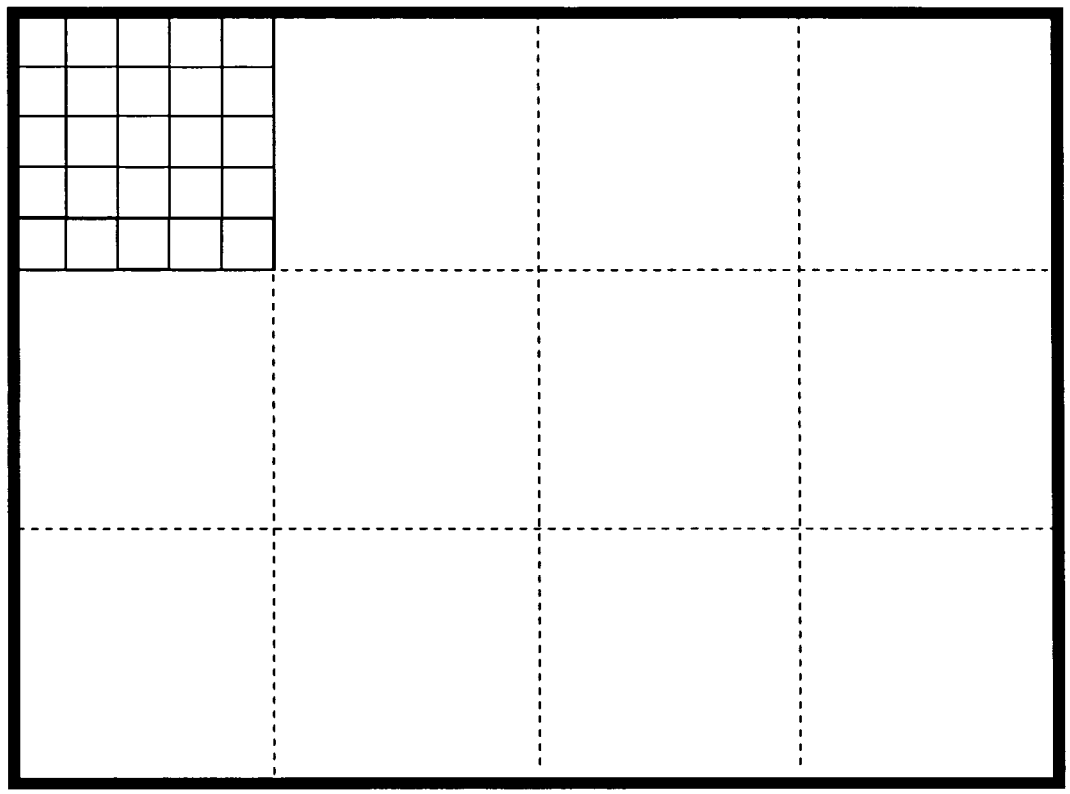
FIG. 5 is a schematic illustration depicting embodiments of the present invention, wherein a focused ion beam tool has finer resolution than an optical interferometer.

FIG. 5 is a schematic illustration of a situation where FIB pixel dimensions are smaller than the optical pixel dimensions. At a given X-Y location for which a surface height can be interferometrically determined, the area resolved and measured by the interferometer comprises approximately 5 by 5 (for illustrative convenience only) pixel locations. In an example where a flat bottomed feature of a single surface height is desired, the surface heights of the optical pixels can be interferometrically measured and ion doses can be calculated based on this measurement. The calculated doses can then be assigned equally to each of the FIB pixels contained within the corresponding optical pixel. In another example that involves processing of a sloping or curved feature, the surface height of a given optical pixel and surrounding optical pixels can be considered to define a local net shape. The focused ion beam pixels contained at the centers of the measured optical pixels can be assigned surface heights based on the measurements for the corresponding optical pixels. The remaining focused ion beam pixels (not corresponding to a center of an optical pixel) can be treated by inferring the surface height (e.g. using linear, quadratic or other interpolation methods) at each FIB pixel location based on estimating the local slope using the surface height measurements of neighboring optical pixels. Doses can be calculated for these "off-center" FIB pixels based on the interpolated surface heights and other considerations, such as the specific rate of milling at a particular angle of incidence (as described above).

Another situation can arise where an interferometer has an optical resolution of about 1 µm and the focused ion beam instrument has a comparable resolution (e.g. an ion beam FWHM of about 1 µm). As for the prior example, the surface profile information determined by the optical interferometer throughout ion beam processing, can be used to update the depths of different locations at the surface and doses required to achieve a desired topography can be calculated based on the interferometric measurements. In this example, there can be a near 1 to 1 resolution of locations between the interferometer and the ion column, and the measured surface height values used directly to calculate doses, with no interpolation required.

Figure 6:
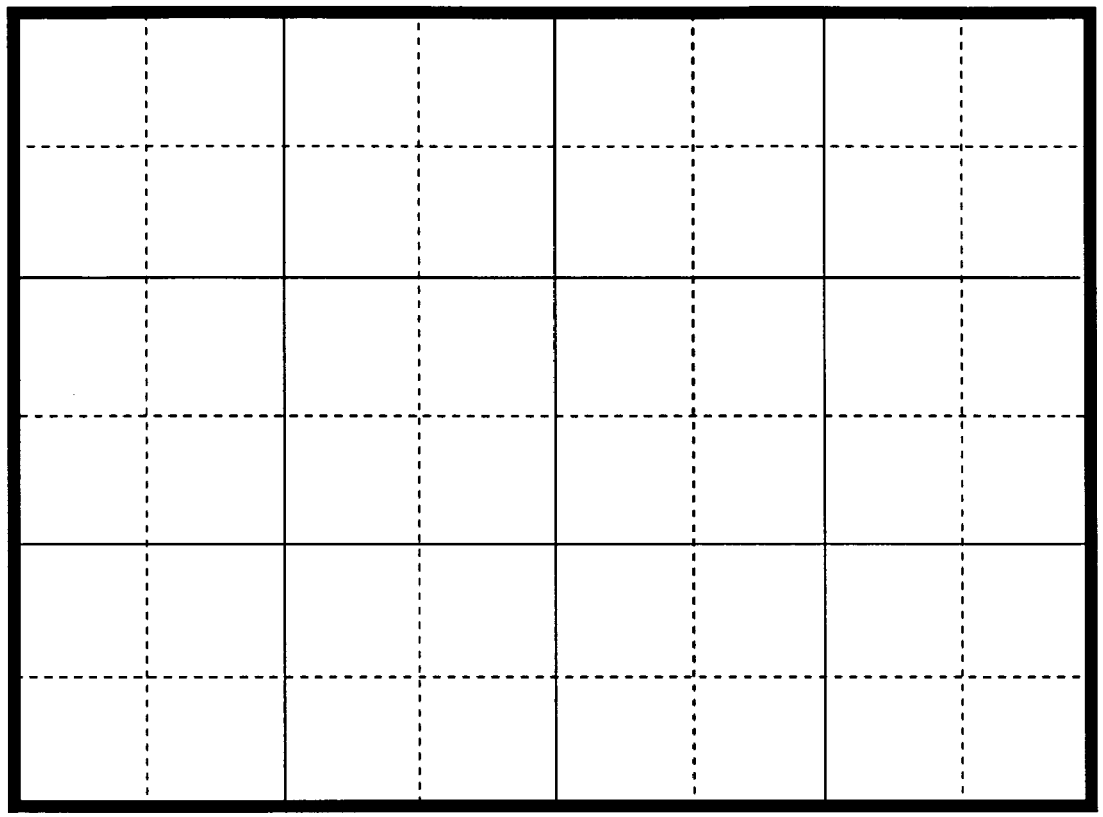
FIG. 6 is a schematic illustration depicting embodiments of the present invention wherein an optical interferometer has finer resolution than a focused ion beam tool.

FIG. 6 illustrates another situation, wherein FIB pixels can be larger than the optical pixels resolvable by an optical interferometer. For example, where for illustrative purposes, 4 optical pixels fit within one FIB pixel, individual measurements from the optical pixels within the FIB pixel can be averaged, and this averaged surface height value assigned to the location of the FIB pixel. A calculation of a dose to be received at a location, i.e. within a FIB pixel, can be based on the average of the surface height values measured for the corresponding four optical pixels.

Embodiments of the present invention include methods to produce a topography at the surface of a specimen by controlling the dose of energetic particles received at specified locations at the surface of the specimen. Exemplary methods control dose by commanding the dwell time of an ion beam at those specified locations. Alternatively, other embodiments of the methods can control dose by specifying a subset of locations that are not exposed to the ion beam. In this latter mode, locations can be removed from the matrix of locations to be exposed to the beam once the desired surface height values are attained at those locations. This approach can be useful in that dwell times for locations to be exposed can be near constant or equal.

The above described exemplary embodiments present several variations of the invention but do not limit the scope of the invention. Those skilled in the art will appreciate that the present invention can be implemented in other equivalent ways. The actual scope of the invention is intended to be defined in the following claims.

What is claimed is:

1. A method of creating a topography at a surface of a specimen, the method comprising:
 providing desired surface height values for one or more locations at the surface of the specimen;
 providing,
  an energetic particle column comprising a source of energetic particles, the energetic particle column operatively arranged to form the energetic particles into a beam,
  a controller connected to the energetic particle column, the controller and the energetic particle column operatively arranged to direct the beam of energetic particles to the one or more locations and to provide doses of energetic particles to the one or more locations and,
  an interferometer integrated with the energetic particle column, the interferometer comprising a light source and a reference mirror, the interferometer connected to the controller, the interferometer operatively arranged with respect to the energetic particle column to illuminate an area at the surface of the specimen comprising at least a part of the one or more locations with a first portion of light from the light source and, to illuminate the reference mirror with a second portion of light from the light source;
 exposing to first doses of energetic particles, the one or more locations;
 measuring current surface height values at the one or more locations by interferometrically combining a reflected first portion of light from the illuminated area, with a reflected second portion of light from the reference mirror;
 comparing the desired surface height values to the current surface height values to determine a difference and, calculating second doses of energetic particles for the one or more locations, based upon the difference; and,
 exposing to second doses of energetic particles, the one or more locations.

2. The method of claim 1 wherein the energetic particles comprise one or more particles selected from the group consisting of ions, electrons, photons and accelerated neutrals.

3. The method of claim 1 wherein the steps of exposing to first doses and exposing to second doses, cause one or more actions selected from the group consisting of adding material to the surface of the specimen and, removing material from the surface of the specimen.

4. The method of claim 1 wherein the step of measuring current surface height values is performed simultaneously with one or more steps selected from the group consisting of exposing to first doses and, exposing to second doses.

5. The method of claim 1 wherein the step of measuring current surface height values is performed sequentially with one or more steps selected from the group consisting of exposing to first doses and, exposing to second doses.

6. The method of claim 5 comprising one or more steps selected from the group consisting of directing the beam of energetic particles away from the surface of the specimen and, turning off the source of energetic particles, prior to the step of measuring current surface height values.

7. The method of claim 1 wherein the surface of the specimen comprises one or more features selected from the group consisting of a planar surface, a multi-planar surface, a faceted surface, a curved surface, and a blind hole.

8. The method of claim 1 wherein the step of measuring current surface height values comprises translating one or more constituents selected from the group consisting of the specimen, a mirror disposed on an optical path and, the reference mirror.

9. The method of claim 1 wherein the reference mirror comprises a reference area at the surface of the specimen, the reference area comprising unexposed locations at the surface of the specimen, the unexposed locations not exposed to the beam of energetic particles.

10. The method of claim 1 wherein at least one step selected from the group consisting of exposing to first doses and, exposing to second doses, comprises exposing the one or more locations to the beam of energetic particles for one or more beam dwell times.

11. The method of claim 1 comprising the step of measuring surface height values at one or more unexposed locations at the surface of the specimen, the one or more unexposed locations not exposed to the beam of energetic particles.

12. The method of claim 1 wherein at least one step selected from the group consisting of exposing to first doses and, exposing to second doses, comprises rastering the beam of energetic particles over the surface of the specimen.

13. The method of claim 12 comprising the step of partitioning one or more doses selected from the group consisting of the first doses and, the second doses, over multiple raster scans.

14. A method of creating a topography at a surface of a specimen, the method comprising:
 providing,
  initial and desired surface height values for one or more locations at the surface of the specimen;

providing, an energetic particle column comprising a source of energetic particles, the energetic particle column operatively arranged to form the energetic particles into a beam, a controller connected to the energetic particle column, the controller and the energetic particle column operatively arranged to direct the beam of energetic particles to the one or more locations and to provide doses of energetic particles to the one or more locations and, an interferometer integrated with the energetic particle column, the interferometer comprising a light source and a reference mirror, the interferometer connected to the controller, the interferometer operatively arranged with respect to the energetic particle column to illuminate an area comprising at least a part of the one or more locations with a first portion of light from the light source and, to illuminate the reference mirror with a second portion of light from the light source;

comparing the initial surface height values to the desired surface height values to determine a first difference and calculating first doses of energetic particles for the one or more locations based upon the first difference;

exposing to the first doses of energetic particles, the one or more locations;

measuring current surface height values at the one or more locations by interferometrically combining a reflected first portion of light from the illuminated area, with a reflected second portion of light from the reference mirror;

comparing the desired surface height values to the current surface height values to determine a second difference and, calculating second doses of energetic particles for the one or more locations based upon the second difference; and, exposing to the second doses of energetic particles, the one or more locations.

15. The method of claim 14 wherein the energetic particles comprise one or more particles selected from the group consisting of ions, electrons, photons and accelerated neutrals.

16. The method of claim 14 wherein the step of providing initial surface height values comprises interferometrically measuring the initial surface height values at the one or more locations.

17. The method of claim 14 wherein the step of providing initial surface height values comprises providing coordinates for the one or more locations and predetermined surface height values for the one or more locations.

18. The method of claim 14 wherein at least one step selected from the group consisting of exposing to first doses and, exposing to second doses, comprises rastering the beam of energetic particles over the surface of the specimen.

19. The method of claim 18 comprising the step of partitioning one or more doses selected from the group consisting of the first doses and, the second doses, over multiple raster scans.

20. An apparatus for creating a topography at a surface of a specimen, the apparatus comprising:

an energetic particle column comprising a source of energetic particles, the energetic particle column operatively arranged to form the energetic particles into a beam;

a controller connected to the energetic particle column, the controller and the energetic particle column operatively arranged to direct the beam of energetic particles to one or more locations at the surface of the specimen and to provide doses of energetic particles to the one or more locations;

an interferometer integrated with the energetic particle column, the interferometer comprising a light source and a reference mirror, the interferometer connected to the controller, the interferometer operatively arranged with respect to the energetic particle column to illuminate an area comprising at least a part of the one or more locations with a first portion of light from the light source and, to illuminate the reference mirror with a second portion of light from the light source, the interferometer comprising at least one objective lens having a working distance equal to or greater than about 32 mm.

21. The apparatus of claim 20 wherein the at least one objective lens comprises a charge dissipative coating.

22. The apparatus of claim 20 wherein the light from the light source comprises a wavelength of from about 510 nm to about 550 nm.

23. An apparatus for creating a topography at a surface of a specimen, the apparatus comprising:

an energetic particle column comprising a source of energetic particles, the energetic particle column operatively arranged to form the energetic particles into a beam;

a controller connected to the energetic particle column, the controller and the energetic particle column operatively arranged to direct the beam of energetic particles to one or more locations at the surface of the specimen and to provide doses of energetic particles to the one or more locations;

an interferometer integrated with the energetic particle column, the interferometer comprising a light source and a reference mirror, the interferometer connected to the controller, the interferometer operatively arranged with respect to the energetic particle column to illuminate an area comprising at least a part of the one or more locations with a first portion of light from the light source and, to illuminate the reference mirror with a second portion of light from the light source, the interferometer comprising an objective mirror having an aperture there through, the objective mirror located between the energetic particle column and the specimen, the objective mirror external of the energetic particle column and, the objective mirror operatively arranged to allow the beam of energetic particles to pass through the aperture and onto the one or more locations at the surface of the specimen.

24. The apparatus of claim 23 wherein the energetic particle column comprises an ion beam column including an ion source.

* * * * *